(12) United States Patent
Cordani, Jr. et al.

(10) Patent No.: US 8,088,246 B2
(45) Date of Patent: Jan. 3, 2012

(54) PROCESS FOR IMPROVING THE ADHESION OF POLYMERIC MATERIALS TO METAL SURFACES

(76) Inventors: John L. Cordani, Jr., Wolcott, CT (US); Kesheng Feng, Cheshire, CT (US); Steven A. Castaldi, Torrington, CT (US); Colleen Mckirryher, Thomaston, CT (US)

( * ) Notice: Subject to any disclaimer, the term of this patent is extended or adjusted under 35 U.S.C. 154(b) by 450 days.

(21) Appl. No.: 12/350,380

(22) Filed: Jan. 8, 2009

(65) Prior Publication Data

US 2010/0170638 A1    Jul. 8, 2010

(51) Int. Cl.
*B41J 2/16*    (2006.01)
*C04B 9/02*    (2006.01)

(52) U.S. Cl. .................... 156/326; 106/14.42; 106/14.44

(58) Field of Classification Search ............... 106/14.42, 106/14.44, 14.45; 156/326
See application file for complete search history.

(56) References Cited

U.S. PATENT DOCUMENTS

| 4,409,037 A | 10/1983 | Landau |
| 4,642,161 A | 2/1987 | Akahoshi et al. |
| 4,775,444 A | 10/1988 | Cordani |
| 4,844,981 A | 7/1989 | Landau |
| 4,902,551 A | 2/1990 | Nakaso et al. |
| 4,981,560 A | 1/1991 | Kajihara et al. |
| 4,997,516 A | 3/1991 | Adler |
| 4,997,722 A | 3/1991 | Adler |
| 5,289,630 A | 3/1994 | Ferrier et al. |
| 5,800,859 A | 9/1998 | Price et al. |
| 5,869,130 A | 2/1999 | Ferrier |
| 6,383,272 B1 | 5/2002 | Ferrier |
| 6,419,784 B1 | 7/2002 | Ferrier |
| 7,153,449 B2 | 12/2006 | Hauf et al. |
| 7,186,305 B2 | 3/2007 | Ferrier |
| 2002/0011416 A1* | 1/2002 | Landau et al. ................. 205/118 |
| 2002/0084193 A1 | 7/2002 | Merricks et al. |
| 2004/0222104 A1* | 11/2004 | Wang et al. .................... 205/291 |
| 2005/0163933 A1 | 7/2005 | Dietsche et al. |
| 2006/0226115 A1 | 10/2006 | Bernards et al. |

FOREIGN PATENT DOCUMENTS

| WO | WO 96/19097 | 6/1996 |
| WO | WO 2008/077045 A2 | 6/2008 |

* cited by examiner

*Primary Examiner* — Philip Tucker
*Assistant Examiner* — Michael Orlando
(74) *Attorney, Agent, or Firm* — Carmody & Torrance LLP

(57) ABSTRACT

An adhesion promoting composition and a process for treating metal surfaces with the adhesion promoting composition is described. The adhesion promoting composition comprises an oxidizer, an acid, a corrosion inhibitor, a source of halide ions and a material selected from a mercapto propane sulfonate, mercapto propane sulfonic acid, and bis-sodium sulfopropyl disulfide. The adhesion promoting composition increases the adhesion of polymeric materials to the metal surfaces and also provides increased acid resistance.

21 Claims, No Drawings

PROCESS FOR IMPROVING THE ADHESION OF POLYMERIC MATERIALS TO METAL SURFACES

FIELD OF THE INVENTION

The present invention relates to various additives that can be used in solutions for treating printed circuit boards to increase adhesion and provide improved acid resistance.

BACKGROUND OF THE INVENTION

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. U.S. Pat. Nos. 4,409,037 and 4,844,981 to Landau, the teachings both of which are included herein by reference in their entirety, describe various improvements involving oxides formed from relatively high chlorite/relatively low caustic copper oxidizing compositions, and producing substantially improved results in circuitry innerlayer adhesion.

The assembled and cured multilayer circuit composite is provided with through-holes which require metallization to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can lead to localized delamination in the multilayer circuit.

The art is well aware of this "pink ring" phenomenon, and has expended extensive effort in seeking to arrive at a multilayer printed circuit fabrication process which is not susceptible to such localized delamination.

One approach to this problem involves post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper, and those species are thereafter dissolved away in a non-oxidizing acid which does not attack or dissolve the portions already reduced to metallic copper. Here again, however, problems can arise in terms of the adhesion between the dielectric layers and metallic copper circuitry innerlayers, firstly because the-bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath (and related U.S. Pat. No. 5,800,859), the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

U.S. Pat. No. 5,869,130 issued to Ferrier teaches a process for increasing the adhesion of a polymeric material to a metal surface comprising contacting the metal surface with an adhesion-promoting composition comprising an oxidizer, an acid, a corrosion inhibitor and a source of halide ions.

With processes such as those disclosed by U.S. Pat. Nos. 5,800,859 and 5,869,130, it has been found advantageous to use a pre-dip directly prior to treatment of the metal surface with the adhesion-promoting composition. The use of a pre-dip can increase the uniformity of the conversion coating achieved in the adhesion-promoting composition. If a pre-dip is used, the pre-dip may generally consist of the same essential composition as the adhesion-promoting composition except at lower concentrations and is used at room temperature. As such, pre-dips currently used in the art of the foregoing processes have typically been composed of a corrosion inhibitor and hydrogen peroxide in an acid matrix with pH below about 2.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (i.e. the circuitry and the intermediate insulating layer), eliminates or minimizes pink ring and operates economically all as compared to conventional processes.

SUMMARY OF THE INVENTION

It is an object of the present invention to provide improved acid resistance of a laminate of copper and a polymeric material.

It is another object of the present invention to provide a treating solution that improves adhesion of a polymeric material to a copper surface.

It is still another object of the present invention to provide a laminate material that resists delamination.

To that end, the inventors herein propose a process for improving the adhesion of polymeric materials to metal surfaces and improving the acid resistance of the resulting laminate. The proposed process comprises:

1) contacting the metal surface with an adhesion-promoting composition comprising:
   a) an oxidizer;
   b) an acid;
   c) a corrosion inhibitor;
   d) a source of halide ions; and
   e) at least one material selected from the group consisting of mercapto propane sulfonic acid, bis-sodium sulfopropyl disulfide, and mercapto propane sulfonate;
2) thereafter bonding the polymeric material to the metal surface.

The inventor has found that the foregoing process improves the adhesion of metal surfaces to the polymeric materials and promotes acid resistance, particularly when the metal surfaces comprise copper or copper alloys. The process proposed is particularly suited to the production of multilayer printed circuit boards.

DETAILED DESCRIPTION OF THE INVENTION

The inventor herein has found that the adhesion between a metal surface and a polymeric material is enhanced by contacting the metal surface with an adhesion-promoting composition prior to bonding the polymeric material to the metal surface. The invention therefore proposes a process for increasing the adhesion of a polymeric material to a metal surface, said process comprising:

1) contacting the metal surface with an adhesion-promoting composition comprising:
   a) an oxidizer;
   b) an acid;
   c) a corrosion inhibitor;
   d) a source of halide ions; and
   e) at least one material selected from the group consisting of mercapto propane sulfonate, bis-sodium sulfopropyl disulfide, and mercapto propane sulfonic acid; and
2) thereafter bonding the polymeric material to the metal surface.

The inventor has found that the proposed adhesion-promoting composition produces a micro-roughened conversion-coated surface upon the metal. The surface produced is particularly suited to bonding with polymeric materials in that significantly increased adhesion values are achieved as compared to a non-treated metal surface. In addition the conversion coated (treated) metal surface maintains the increased adhesion over time and decreases the likelihood of any unwanted reactions occurring over time between the metal and the polymeric material.

The process proposed is particularly suited to the manufacture of multilayer printed circuit boards. Thus, in this application, the metal circuitry (usually copper) of the inner-layers is treated with the adhesion-promoting composition proposed herein. After treatment, followed by water rinsing, the innerlayers are bonded together with polymeric materials such as pre-pregs or imageable dielectrics, resulting in the multilayer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 0.5 to 120 grams per liter but is preferably from 2 to 60 grams per liter and is most preferably from 3 to 30 grams per liter.

The acid utilized in the adhesion-promoting composition may be any acid that is stable in the matrix. However, the inventors have found mineral acids to be particularly preferred. Sulfuric acid is especially preferred. The concentration of the acid in the adhesion-promoting composition may range from 1 to 360 grams per liter but is preferably from 20 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. Benzotriazoles are particularly preferred. The concentration of the corrosion inhibitor in the adhesion-promoting composition may range from 0.1 to 50 grams per liter but is preferably from 0.2 to 5 grams per liter.

The adhesion promoting composition also contains a source of halide ions. The source of halide ions may be any compound which would provide halide ions in the matrix of the adhesion-promoting composition. Preferably, the source of halide ions is alkali metal salts such as sodium chloride or potassium chloride, oxohalides such as sodium chlorate or potassium chlorate, or halide bearing mineral acids such as hydrochloric acid. Preferably the source of halide ions provides chloride ions to the adhesion-promoting composition. The concentration of the source of halide ions in the adhesion-promoting composition may range from 0.5 to 500 milligrams per liter but is preferably from 1 to 12 milligrams per liter, all based on halide ion content.

The adhesion promoting composition also comprises at least one material selected from the group consisting of a mercapto propane sulfonate or mercapto propane sulfonic acid (MPS) and a bis-sodium sulfopropyl disulfide (SPS). The addition of MPS and/or SPS to the adhesion promoting composition provides increased adhesion between the metal and the polymeric layer and also provide increased acid resistance. Other similar mercapto sulfonate compounds would also be usable in the compositions described herein. Preferred amounts for use in the compositions of the invention include concentrations of between about 300 and 800 ppm, preferably about 300 ppm for MPS and of between about 600 and 1000 ppm, preferably about 600 ppm for SPS.

Optionally, the adhesion-promoting composition may also comprise a water soluble polymer. If used, the water soluble polymer is preferably not a wetter or surfactant but is instead a water soluble homopolymer or copolymer of low molecular weight water soluble monomers. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide Company under the tradename Carbowax. The inventors have found Carbowax 750 and Carbowax MPEG 2000 to be particularly useful. Also particularly useful are the ethylene oxide polymers or ethylene oxide-propylene oxide copolymers sold by the BASF or Company under the Pluronic tradename. The concentration of the water soluble polymer in the adhesion-promoting composition can range from 0.2 to 15 grams per liter, but is preferably from 3 to 6 grams per liter.

Thus, the adhesion-promoting composition should contain an acid, an oxidizer, a corrosion inhibitor, a source of halide ions and at least one material selected from the group consisting of a mercapto propane sulfonate and a sodium salt of a mercapto propane sulfonate. Preferably the composition may also comprise a water soluble polymer.

Optionally, but preferably, the metal surface may be contacted with a neutral, alkaline (preferably pH 7-13, more preferably pH 8-12) or acid (preferably pH 1-7, more preferably pH 1.5-3.5 ) pre-dip immediately prior to contacting the metal surface with the adhesion promoting composition. It has been discovered that contacting the metal surface to be treated in the adhesion-promoting composition with a pre-dip solution directly prior contact with the adhesion-promoting composition can increase the uniformity of the conversion coating formed. The inventors have discovered that the use of a pre-dip with a pH in the range of 7 to 13, preferably in the range of 8 to 12 and most preferably in the range of 9 to 10 is most beneficial in improving the uniformity of the conversion coating. When hydrogen peroxide is used in the pre-dip, the inventors have discovered that the use of a pre-dip with pH in the range of 1 to 7, preferably in the range of 1.5-3.5 is also beneficial in improving the uniformity of the conversion coating. The pre-dip may comprise an aqueous solution of a corrosion inhibitor(s) with the pH adjusted into the foregoing ranges, preferably the corrosion inhibitor(s) is the same or similar to those used in the adhesion-promoting composition. If used, the concentration of corrosion inhibitor in the pre-dip may range from 0.1 to 50 grams per liter preferably from 0.2 to 5 grams per liter.

In the alternative, or in addition thereto, the pre-dip may comprise an aqueous solution adjusted such that the pH is within the foregoing recommended ranges and in that case the pre-dip preferably also comprises a buffer, such as trisodium phosphate, sodium bicarbonate, sodium carbonate, borax, or mixtures of the foregoing. Potassium carbonate, potassium bicarbonate and tripotassium phosphate are also useful. If used, the concentration of buffer in pre-dip may range from 0.1 to 50 grams per liter but is preferably from 0.5 to 10 grams per liter. In all cases, the pH of the pre-dip may be adjusted such that it falls within the foregoing given ranges of pH with acids or bases such as sulfuric acid or sodium hydroxide. The metal surfaces to be treated are preferably contacted with the pre-dip at room temperature for from about 15 seconds to about 5 minutes, preferably from about 30 seconds to about 2 minutes. The metal surfaces are then contacted with the adhesion-promoting composition, preferably without any rinsing in between.

The metal surface can be treated with the adhesion-promoting composition in a variety of ways, including immersion, spray, or flood. The temperature of the adhesion-promoting composition during treatment may typically range from about 80° F. to about 150° F. but is preferably from about 90° F. to about 120° F. The treatment time will vary depending upon the temperature and method of treatment but may typically range from about 15 seconds to 15 minutes and preferably from about 1 to 2 minutes.

The following example is illustrative of the invention but should not be taken as limiting:

EXAMPLE

The following cycle was used in processing the copper clad panels and copper foils in all of the following examples:
Predip
2% v/v 50% by weight hydrogen peroxide
1 g/l Benzotriazole
10 ppm NaCl as Cl—
pH—5.9
Adhesion Promoting Composition
3.1% v/v 50% by weight hydrogen peroxide
4.8% by weight Sulfuric Acid
5 g/l Benzotriazole
10 ppm NaCl as Cl—
MPS or SPS as noted in Table 1 and Table 2

The pre-dip was always used for 30 seconds at room temperature followed by the adhesion promoting bath at about 38° C. for 1 minute. A rate panel was run with each panel and all panels were then baked, soldered and peeled to test adhesion. After etch rates were calculated, the rate panels were used to test acid resistance. Panels were immersed half way in a 50% HCl solution for 30 seconds and the rinsed for 30 seconds.

The results are presented below. Table 1 describes the various conditions using mereapto propane sulfonate (MPS) and Table 2 describes the various conditions using bis sodium sulfopropyl disulfide (SPS).

TABLE 1

Adhesion Promoting Composition Containing Varying Amounts of MPS

| Concentration MPS (ppm) | 0 s solder | 30 s solder | 60 s solder | Color change |
|---|---|---|---|---|
| 0 | 4.1 | 2.7 | 1.5 | Very slight (delamination) |
| 200 | 4.3 | 3.0 | 2.3 | None (delamination) |
| 300 | 4.3 | 3.0 | 2.3 | None (delamination) |
| 400 | 4.6 | 3.8 | 3.4 | None |
| 500 | 4.6 | 3.7 | 3.2 | None |
| 600 | 4.5 | 3.5 | 2.6 | Very slight |
| 800 | 4.3 | 3.8 | 3.2 | None |
| 1000 | 5.0 | 4.0 | 3.1 | None (slight delamination) |

TABLE 1-continued

Adhesion Promoting Composition Containing Varying Amounts of MPS

| Concentration MPS (ppm) | 0 s solder | 30 s solder | 60 s solder | Color change |
|---|---|---|---|---|
| control | 4.5 | 3.4 | 2.4 | Slight (delamination) |
| control | 4 | 2.7 | 1.5 | Slight (delamination) |

TABLE 2

Adhesion Promoting Composition Containing Varying Amounts of SPS

| Concentration SPS (ppm) | 0 s solder | 30 s solder | 60 s solder | Color change |
|---|---|---|---|---|
| 0 | 3.9 | 2.6 | 1.0 | Slight (delamination) |
| 10 | 4.0 | 2.6 | 1.5 | Slight (delamination) |
| 50 | 4.0 | 2.9 | 2.4 | Slight (delamination) |
| 100 | 4.5 | 3.5 | 3.0 | Slight (delamination) |
| 400 | 4.2 | 3.0 | 2.7 | None (delamination) |
| 600 | 4.4 | 3.8 | 3.4 | None |
| 800 | 4.4 | 3.5 | 3.3 | None |
| 1000 | 5.0 | 4.4 | 3.8 | None |
| control | 4.5 | 3.4 | 2.4 | Slight (delamination) |
| control | 4.0 | 2.7 | 1.5 | Slight (delamination) |

It is noted that both SPS and MPS provided excellent acid resistance. Preferred amounts include those above about 400 ppm for SPS and about 300 ppm for MPS, both of which seem to make the problem of acid resistance almost non-existent. In addition, it was found that both SPS and MPS provide significant advantages for adhesion.

All panels with greater than 600 ppm SPS or greater than about 400 ppm MPS showed no delamination at all. In contrast the controls (i.e. no MPS or SPS) showed delamination. There is an increase in adhesion with SPS and MPS as compared to the controls. Therefore it can be seen that both SPS and MPS are excellent adhesion promoters as well as provide excellent acid resistance.

What is claimed is:

1. An adhesion promoting composition useful in treating metal surfaces prior to bonding polymeric materials to the metal surfaces, the adhesion promoting composition comprising:
   a) an oxidizer;
   b) an inorganic acid;
   c) a corrosion inhibitor;
   d) a source of halide ions; and
   e) at least one material selected from the group consisting of a mercapto propane sulfonate, mercapto propane sulfonic acid, and bis-sodium sulfopropyl disulfide.

2. The adhesion promoting composition according to claim 1, wherein the oxidizer is hydrogen peroxide.

3. The adhesion promoting composition according to claim 1, wherein the inorganic acid is a mineral acid.

4. The adhesion promoting composition according to claim 3, wherein the mineral acid is sulfuric acid.

5. The adhesion promoting composition according to claim 1, wherein the corrosion inhibitor is selected from the group consisting of triazoles, benzotriazoles, tetrazoles, imidazoles, benzimidazoles and combinations of one or more of the foregoing.

6. The adhesion promoting composition according to claim 5, wherein the corrosion inhibitor is a benzotriazole.

7. The adhesion promoting composition according to claim 1, wherein the at least one material is mercapto propane sulfonate.

8. The adhesion promoting composition according to claim 7, wherein the mercapto propane sulfonate is present in the composition at a concentration of between about 300 ppm and about 800 ppm.

9. The adhesion promoting composition according to claim 1, wherein the at least one material is bis-sodium sulfopropyl disulfide.

10. The adhesion promoting composition according to claim 9, wherein bis-sodium sulfopropyl disulfide is present in the composition at a concentration of between about 600 ppm and about 1000 ppm.

11. A process for increasing the adhesion of a polymeric material to a metal surface, wherein the metal surface comprises copper, the process comprising:
   a) contacting the metal surface with an adhesion promoting composition comprising:
      1) hydrogen peroxide;
      2) an inorganic acid;
      3) a corrosion inhibitor;
      4) a source of halide ions; and
      5) at least one material selected from the group consisting of a mercapto propane sulfonate, mercapto propane sulfonic acid, and bis-sodium sulfopropyl disulfide; and thereafter
   b) bonding the polymeric material to the metal surface.

12. The method according to claim 11, wherein the inorganic acid is a mineral acid.

13. The method according to claim 12, wherein the mineral acid is sulfuric acid.

14. The method according to claim 11, wherein the corrosion inhibitor is selected from the group consisting of triazoles, benzotriazoles, tetrazoles, imidazoles, benzimidazoles and combinations of one or more of the foregoing.

15. The method according to claim 14, wherein the corrosion inhibitor is a benzotriazole.

16. The method according to claim 11, wherein the at least one material is mercapto propane sulfonate.

17. The method according to claim 16, wherein the mercapto propane sulfonate is present in the composition at a concentration of between about 300 ppm and about 800 ppm.

18. The method according to claim 11, wherein the at least one material is bis-sodium sulfopropyl disulfide.

19. The method according to claim 18, wherein bis-sodium sulfopropyl disulfide is present in the composition at a concentration of between about 600 ppm and about 1000 ppm.

20. The method according to claim 11, wherein the metal surface is contacted with a pre-dip solution immediately prior to contacting the metal surface with the adhesion promoting composition.

21. The method according to claim 11, wherein the metal surface comprises a copper or copper alloy surface.

* * * * *